United States Patent
Mamourian et al.

(10) Patent No.: US 8,416,076 B2
(45) Date of Patent: Apr. 9, 2013

(54) MAGNETIC PROXIMITY SENSOR SYSTEM AND ASSOCIATED METHODS OF SENSING A MAGNETIC FIELD

(75) Inventors: Alexander Mamourian, Wayne, PA (US); Michael Holland, Norwich, VT (US)

(73) Assignee: The Trustees of Dartmouth College, Hanover, NH (US)

( * ) Notice: Subject to any disclaimer, the term of this patent is extended or adjusted under 35 U.S.C. 154(b) by 1042 days.

(21) Appl. No.: 12/417,427

(22) Filed: Apr. 2, 2009

(65) Prior Publication Data

US 2009/0251316 A1 Oct. 8, 2009

Related U.S. Application Data

(60) Provisional application No. 61/041,886, filed on Apr. 2, 2008.

(51) Int. Cl.
*G08B 13/24* (2006.01)
(52) U.S. Cl. .................. 340/551; 340/686.1; 340/686.6; 324/200; 324/326; 324/207.26; 600/411; 600/410
(58) Field of Classification Search .................. 340/551, 340/552, 686.1, 686.6; 324/326, 200, 323, 324/207.26, 313; 600/411, 410
See application file for complete search history.

(56) References Cited

U.S. PATENT DOCUMENTS

| | | | |
|---|---|---|---|
| 5,311,130 A * | 5/1994 | Bill et al. ...................... 340/600 |
| 5,512,823 A * | 4/1996 | Nepveu ......................... 340/600 |
| 5,629,622 A * | 5/1997 | Scampini ...................... 340/600 |
| 5,811,971 A | 9/1998 | Senda et al. |
| 5,952,734 A | 9/1999 | Gelbien |
| 6,150,810 A * | 11/2000 | Roybal .......................... 340/551 |
| 6,232,776 B1 | 5/2001 | Pant et al. |
| 6,564,084 B2 | 5/2003 | Allred, III et al. |
| 6,566,872 B1 | 5/2003 | Sugitani |
| 6,707,301 B2 | 3/2004 | Goto |
| 7,113,092 B2 * | 9/2006 | Keene ........................... 340/551 |
| 7,315,166 B2 * | 1/2008 | Czipott et al. ................ 324/244 |
| 7,414,400 B2 * | 8/2008 | Hoult ............................ 340/551 |
| 7,696,751 B2 * | 4/2010 | Molyneaux et al. .......... 324/301 |
| 2003/0171669 A1 * | 9/2003 | Kopp ............................ 600/410 |
| 2004/0135687 A1 | 7/2004 | Keene |
| 2005/0242804 A1 | 11/2005 | Hintz et al. |

(Continued)

OTHER PUBLICATIONS

"Ferromagnetic Detection System", ETS Lindgren Product Bulletin © 2003, 2 pages.

(Continued)

*Primary Examiner* — Eric M Blount
(74) *Attorney, Agent, or Firm* — Lathrop & Gage LLP

(57) ABSTRACT

A magnetic proximity sensor is attached to a ferrous object such that the sensor alerts a practitioner if a threshold of magnetic strength has been exceeded by bringing the ferrous object within a certain proximity to the magnet of an MRI scanner. The magnetic proximity sensor includes at least one magnetic field sensor for sensing a magnetic field strength. An alarm in communication with the field sensor alerts a practitioner that a threshold of magnetic strength has been exceeded. A battery powers the field sensor and the alarm. The field sensor may produce an output voltage corresponding to the sensed magnetic field strength, and a potentiometer may provide a reference voltage corresponding to a threshold magnetic field strength. A comparator compares the reference voltage to the output voltage, and triggers an alarm if the output voltage exceeds the reference voltage.

25 Claims, 8 Drawing Sheets

U.S. PATENT DOCUMENTS

2007/0057786 A1*  3/2007  McClure et al. ............... 340/551
2007/0132581 A1*  6/2007  Molyneaux et al. ........... 340/551
2007/0296576 A1* 12/2007  Holowick ................ 340/539.21
2008/0281187 A1* 11/2008  Massengill et al. ........... 600/424

OTHER PUBLICATIONS

"Metal detector promises increased safety in MR suites", Diagnostic Imaging Online, Apr. 21, 2004, http://dimag.com/dinews/2004041302.shtml, retrieved from the Internet Feb. 1, 2006, 2 pages.

"Ferroguard® for MRI Hospital Safety", QinetiQ, http/www.qinetiq.com, retrieved from the Internet Feb. 1, 2006, 2 pages.

"Natural Electric/Magnetic Field Meter", http/www.orgonlab.org, retrieved from the Internet Feb. 1, 2006, 2 pages.

"AC/DC Measurement Equipment Gauss Meter", Integrity Design & Research Corporation, http/www.gaussmeter.info/dc-gauss.html, retrieved from the Internet Feb. 1, 2006, pp. 1-13.

"Ferralert", Ferralert HTML version systems brochure, http/www.koppdevelopment.com, retrieved from the Internet Feb. 1, 2006, 3 pages.

Gosbee, J. & DeRosier, J., "MRI Hazard Summary", VA National Center for Patient Safety, retrieved from the Internet Feb. 1, 2006, http/www.va.gov/NCPS/SafetyTopics/mrihazardsummary.html, pp. 1-6.

Ladegard, J. et al., Thayer School of Engineering, Dartmouth College, Engineering 290 Final Report MRI Gauss Detection Device, Mar. 8, 2004, 89 pages.

Ladegard, J. et al., Thayer School of Engineering, Dartmouth College, Parts Book—an exhaustive list of all the devices used in the development of the Gauss Detection Device, Mar. 8, 2004, 130 pages.

* cited by examiner

MAGNETIC PROXIMITY SENSOR SYSTEM AND ASSOCIATED METHODS OF SENSING A MAGNETIC FIELD

RELATED APPLICATIONS

This application claims priority of U.S. Provisional Application No. 61/041,886, filed Apr. 2, 2008, incorporated herein by reference.

BACKGROUND

Since its introduction, magnetic resonance imaging (MRI) has provided physicians and clinicians with an unparalleled window into the human body. Using a magnetic field in combination with radio waves, MRI produces detailed images of internal organs and body systems, without subjecting a patient to the radiation incurred during traditional x-ray or CT scan procedures. A strong magnet contained in an MRI scanner generates a field which causes molecules in the body to align. The molecules are briefly excited by radio waves as they return to their original condition. During this process, the molecules emit signals that are received and converted into images by a computer. The procedure itself is painless and, in some cases, may eliminate hospitalization for other diagnostic testing and costs associated therewith. The MRI procedure itself is quite safe—the imaging does not damage body tissues.

Despite the apparent advantages of MRI, the potential for interaction between the MRI scanner and ferrous metal objects, either internal or external to the patient, is cause for concern. For example, the MRI magnet (typically 5,000 to 20,000 Gauss, although magnets as strong as 30,000 Gauss are now available) may move internal objects such as metal pins or plates within a patient's body, and may interfere with the functioning of a pacemaker. External metallic objects ranging from hairpins to crash carts have been projectilized by the magnetic field of MRI scanners, causing injury, and even death, to patients undergoing the procedure and to attending staff. In one well-publicized 2001 accident, a six year-old boy undergoing MRI was killed when an oxygen tank was pulled into the bore of the scanner. When brought within reach of the magnetic field, the oxygen tank flew into the scanner and fractured the boy's skull, causing a fatal cerebral hemorrhage.

SUMMARY

In one embodiment, a magnetic proximity sensor system includes a magnetic field sensor for sensing a magnetic field strength. An alarm in communication with the field sensor alerts a practitioner if a threshold of magnetic strength has been exceeded.

In one embodiment, a magnetic proximity sensor system includes a magnetic field sensor for sensing an external magnetic field and generating an output voltage corresponding to a strength of the magnetic field. A potentiometer produces a reference voltage corresponding to a threshold magnetic field strength, and a comparator compares the reference voltage to the output voltage. An alarm in communication with the comparator indicates when the output voltage exceeds the reference voltage.

In one embodiment, a magnetic proximity sensor system has a plurality of field sensors for sensing a positive or a negative external magnetic field and for generating output voltages corresponding to a strength of the positive or negative magnetic field. A first potentiometer produces a first reference voltage corresponding to a threshold of positive magnetic field strength. A first comparators in communication with the first potentiometer and the field sensors, compares the first reference voltage to the output voltages, to determine whether the output voltages exceed the first reference voltage. A second potentiometer produces a second reference voltage corresponding to a threshold of negative magnetic field strength. A second comparator, in communication with the second potentiometer and the field sensors, compares the second reference voltage to the output voltages, to determine whether the output voltages exceed the first reference voltage. An alarm in communication with the first and second comparators indicates when the output voltages exceed the first or the second reference voltage.

In one embodiment, a method of detecting magnetic field strength includes sensing a magnetic field with at least one magnetic field sensor, and generating an output voltage corresponding to a strength of the magnetic field. A reference voltage is provided and compared to the output voltage. If the output voltage is greater than the reference voltage, an alarm is activated.

In one embodiment, a method for preventing magnetic interaction between a mobile ferrous object and an MRI scanner includes attaching a magnetic proximity sensor to the ferrous object and sensing an external magnetic field with the magnetic proximity sensor. An alarm is generated if the sensed external magnetic field exceeds a threshold magnetic field strength.

DETAILED DESCRIPTION

The disclosed magnetic proximity sensor system is designed to alert a practitioner (e.g., a physician, technologist, anesthesiologist or attending MRI staff) that a movable metal object (e.g., a crash cart, oxygen tank or metallic bucket) has passed beyond a threshold of magnetic strength (e.g., 20 Gauss). The allowable magnetic strength can be preset, thereby allowing appropriate intervention before the metal object gets too close to the MRI scanner magnet.

Figure 1:
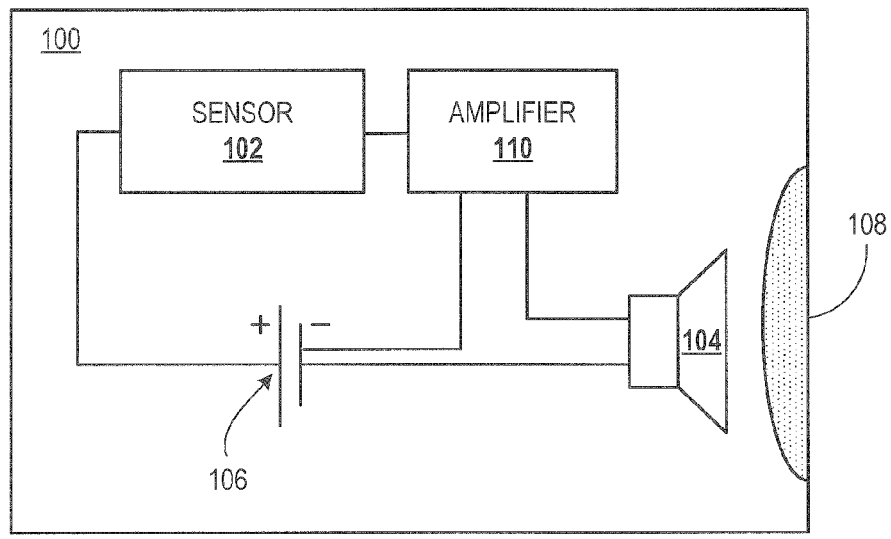
FIG. 1 is a schematic illustration of a magnetic proximity sensor system.

The magnetic proximity sensor system is intended to add a layer of safety for practitioners and patients so that appropriate boundaries are respected for hardware that has magnetic properties but that still needs to be in the scanner room. FIG. 1 shows one embodiment of a magnetic proximity sensor system 100. System 100 includes a magnetic field sensor 102, an alarm 104 and a battery 106. Field sensor 102 is for example a magnetic reed switch or a Hall effect semiconductor switch. A Hall effect semiconductor switch may enhance directional sensitivity of the sensor as compared to a conventional reed switch; however, a modified reed switch (described herein with respect to FIGS. 5, 6 and 7) may provide directional sensitivity comparable to the Hall effect switch, while improving power efficiency of system 100.

Alarm 104 may be a buzzer, bell, beeper or similar noise making device that outputs an audible signal. A speaker 108 broadcasts the signal from alarm 104, and an optional amplifier 110 amplifies the signal. Alarm 104 may alternatively be, or optionally include, a visual alarm, such as a flashing or blinking light, to provide awareness of the magnetic proximity sensor in loud environments, such as an MRI suite. Field sensor 102 may also include a tactile alarm, for example vibrating upon play of the alarm signal, to further draw attention. Battery 106 can be alkaline or lithium and for example ranges from 3-6 Volts. Alarm 104 is for example triggered when field sensor 102 detects a five Gauss magnetic field level. This level corresponds to the generally recognized "safe distance" from an MRI scanner.

Figure 2:
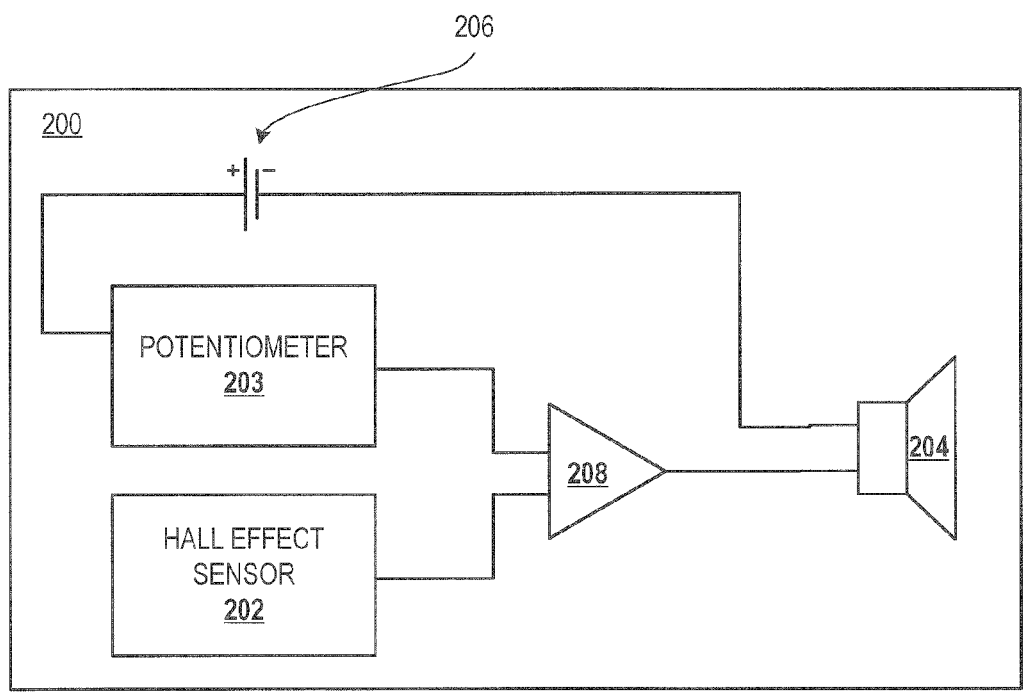
FIG. 2 is a schematic illustration of a magnetic proximity sensor system with a Hall Effect sensor.

FIG. 2 shows an embodiment of a magnetic proximity sensor system 200 with a Hall effect sensor 202. Hall effect sensor 202 uses a potentiometer 203 to create a voltage, used to set an alarm 204 to the desired Gauss default (e.g., five). Potentiometer 203 can be a commercially available potentiometer such as the 10k Bourns 3262 Trimming Potentiometer or a Spectral 50k 43P503. The power source for proximity sensor system 200 is important because calibration of the Hall effect sensor 202 relies on the voltage through the circuit. Battery 206 is, for example, a 6 Volt 23-469 Radio Shack Alkaline. Alarm 204 is a sound device (e.g., a bell or buzzer) with an average decibel output that is louder than the ambient noise in an MRI facility. Alarm 204 for example emits sound rated at about 90 dB. This approximately 30 dB louder than the ambient noise of an average MRI facility. Although medical personnel and objects generally do not enter the MRI room during imaging, alarm 204 may also be louder than the ambient noise in an MRI room during imaging; this guards against metal objects being brought too close to a functioning MRI scanner if medical personnel must enter the MRI room during scanning, due to an emergency. To draw attention in a loud environment (e.g., during scanning), alarm 204 may include (or may alternatively be) the visual and tactile features described above with respect to FIG. 1.

Comparator 208 compares the voltage from the Hall effect sensor 202 to potentiometer 203. A commercially available comparator is acceptable such as the LM339 low power low offset voltage quad comparator. When voltage from the Hall Sensor is higher than voltage from potentiometer 203, then the magnetic field acting on the device has exceeded the level setting, e.g., five Gauss.

Figure 3A:
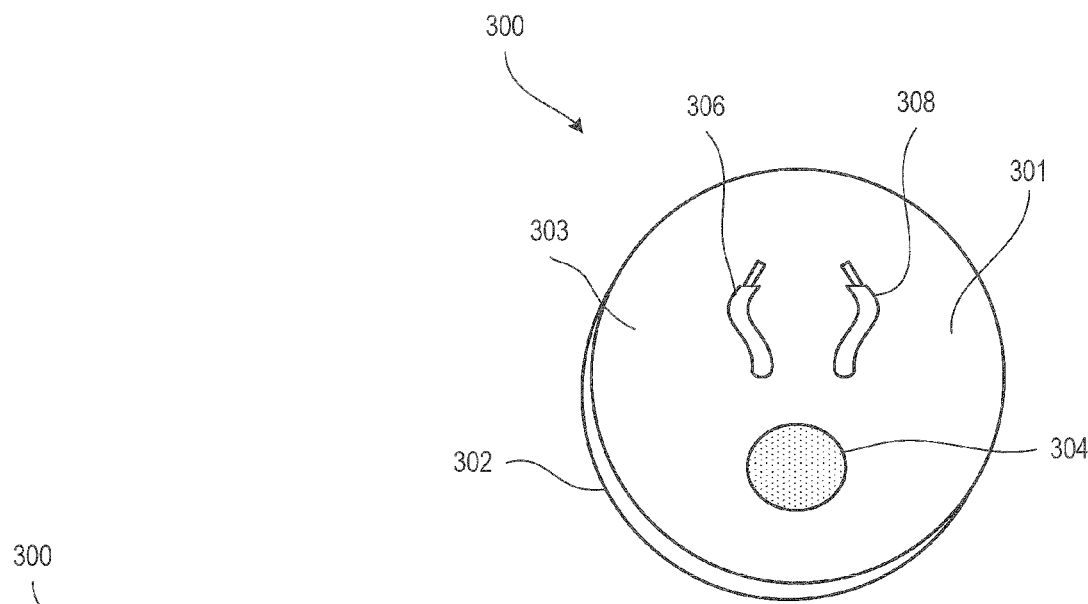
FIG. 3A is a top view of a magnetic proximity sensor system as detailed in FIG. 1 or FIG. 2.

FIG. 3A shows a top view of a magnetic proximity sensor system 300. Magnetic proximity sensor system 300 for example includes the components discussed with respect to FIG. 1 or FIG. 2. Sensor system 300 includes a body 301. As shown in FIG. 3A, body 301 is circular or coin-shaped; however, body 301 may be formed as a square, rectangle, star or other geometric or abstract shape.

Body 301 includes an outer casing 302 enclosing a potting material 303. Outer casing 302 encases the entire circuit (see FIG. 1, 2) except an emitting portion (e.g., a speaker) of an alarm (e.g., a visual, tactile and/or audible alarm) 304. Potting material 303 may be plastic, silicon or any substantially hard and durable material, such as potting resin CR 300, for coating and protecting internal components of sensor system 300. Casing 302 may be an outer surface of potting material 303, for example when sensor system 300 is formed by hardening a portion of potting material 303 around internal components (e.g., by pouring potting material 303 into a mold). Positive and negative connectors 306 and 308 optionally extend from potting material 303 and casing 302 in order to connect to an external battery. Alternately, electrical connections/contacts (e.g., a plug or a cord) for connecting to an external power source may be provided with casing 302.

Figure 3B:
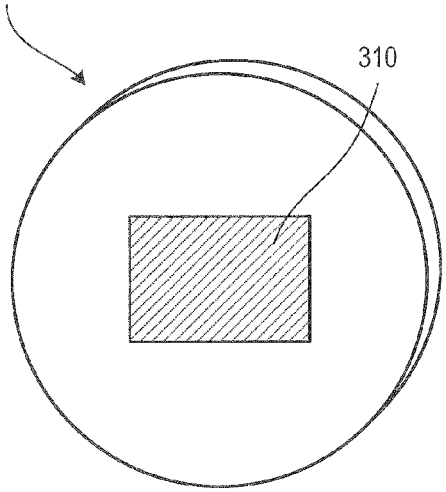
FIG. 3B is a back view of the magnetic proximity sensor system of FIG. 3A with an adhesive backing.
Figure 3C:
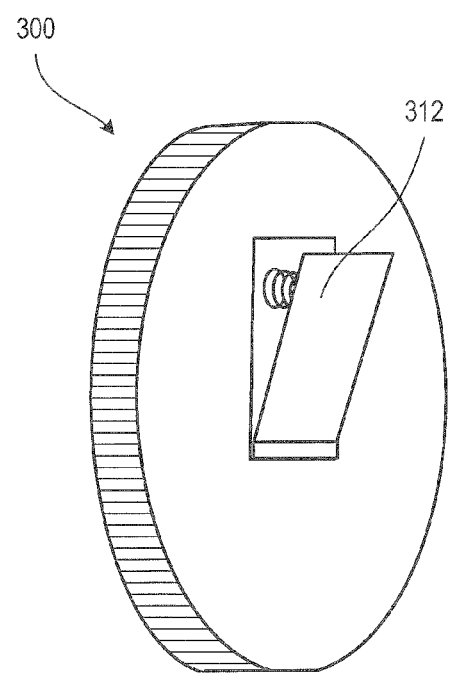
FIG. 3C is a back view of the magnetic proximity sensor system of FIG. 3A, with a fastener.

FIG. 3B is a back view of the magnetic proximity sensor system 300. In one embodiment, an optional adhesive device 310 is used to secure system 300 to a mobile ferrous object. Adhesive device 310 may be a tape, glue or other suitable adhesive. Optionally, as shown in FIG. 3C, a fastener 312 is provided with magnetic proximity sensor system 300. Fastener 312 is shown as a clip attached to a back surface of system 300; however, fastener 312 may be any fastener suitable for attaching system 300 to the mobile ferrous object, such as a clamp, strap, snap or Velcro. Likewise, fastener 312 may be provided elsewhere on system 300, e.g., on a top, bottom or side surface.

Figure 4:
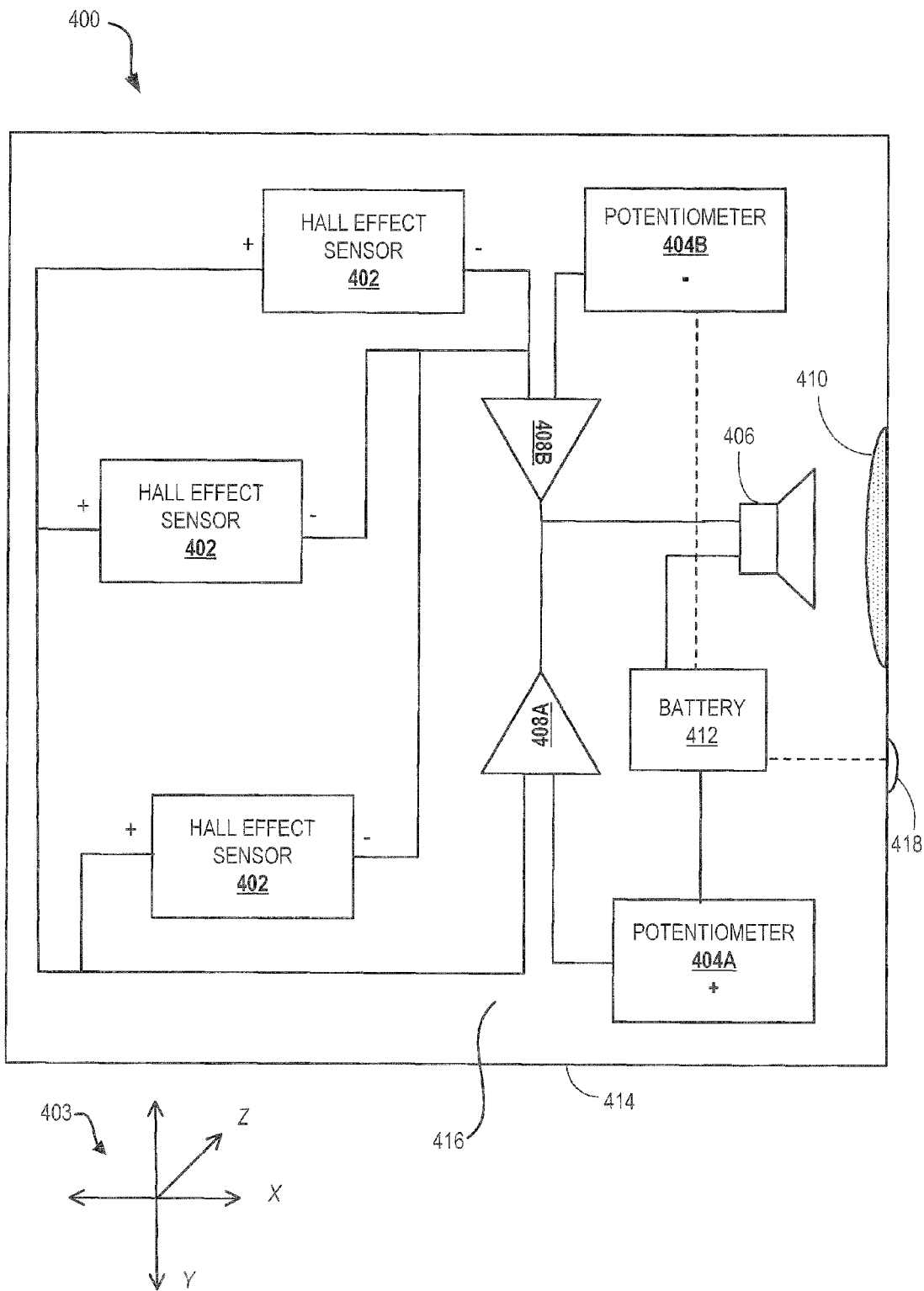
FIG. 4 is a schematic illustration of a magnetic proximity sensor system with internal Hall effect sensors, comparators and potentiometers.

FIG. 4 schematically shows a magnetic proximity sensor system 400. System 400 includes three Hall effect sensors 402, for sensing magnetic fields along x, y and z planes, indicated by coordinates 403. Hall effect sensors 402 are for example bipolar Hall sensors such as the Melexis' Linear Hall Effect Sensor MLX90215 LCO3. Two potentiometers 404A and 404B create an electrical current through Hall effect sensors 402. Potentiometer 404A is for example set to provide a voltage sufficient to trigger an alarm 406 when sensors 402 detect a magnetic field greater than positive five Gauss. Potentiometer 404B is for example set to provide a voltage sufficient to trigger alarm 406 when sensors 402 detect magnetic field stronger than negative five Gauss. Comparators 408A and 408B compare the fixed voltages provided by potentiometers 404A and 404B, respectively, with voltages from Hall effect sensors 402. For example, when comparator 408A determines that the voltage from Hall sensors 402 is greater than the voltage provided by potentiometer 404A, then the magnetic field acting upon sensor system 400 has exceeded five Gauss.

Upon detecting a magnetic field beyond the default threshold (e.g. five Gauss), alarm 406 is triggered. An optional speaker 410 may be provided to broadcast output from alarm 406, or alarm 406 may include a sound emitting portion. For example, alarm 406 may be a miniature buzzer such as the Radio Shack 12VDC Piezo Mini Buzzer 273-074. Comparators 408A and 408B may be small, multi-comparator chips such as LM 339 quad-comparator chips by National Semiconductor. Potentiometers 404A, 404B are for example variable resistors such as the 10K Bourns 3262. A battery 412 powers sensors 402, potentiometers 404, alarm 406 and comparators 408. Battery 412 may also provide power to one or more capacitors (not shown). For example, 10 µF capacitor and a 0.1 µF capacitor may be included with sensor system 400, to minimize voltage variances in internal circuitry.

Battery 412 may be contained within a housing 414, along with the above-mentioned components and circuitry of magnetic proximity sensor system 400. Optionally, electrical connections/contacts may be provided with sensor system 400 such that sensor system 400 is connectable to an external battery or power source. Alarm 406 or speaker 410 may be surrounded but not covered by housing 414, to allow for sound emission.

Housing 414 may surround or be formed by a potting material 416. Potting material 416 is for example a plastic, silicon or other durable material such as potting resin CR 300. Sensor system 400 may be formed by placing potting material 416 and sensors 402, potentiometers 404, alarm 406, comparators 408, speaker 410 and battery 412 in a mold. Once hardened, an outer layer of potting material 416 forms housing 414. An on/off switch or button 418 may be provided to conserve battery power when sensor system 400 is not in use.

Figure 5:
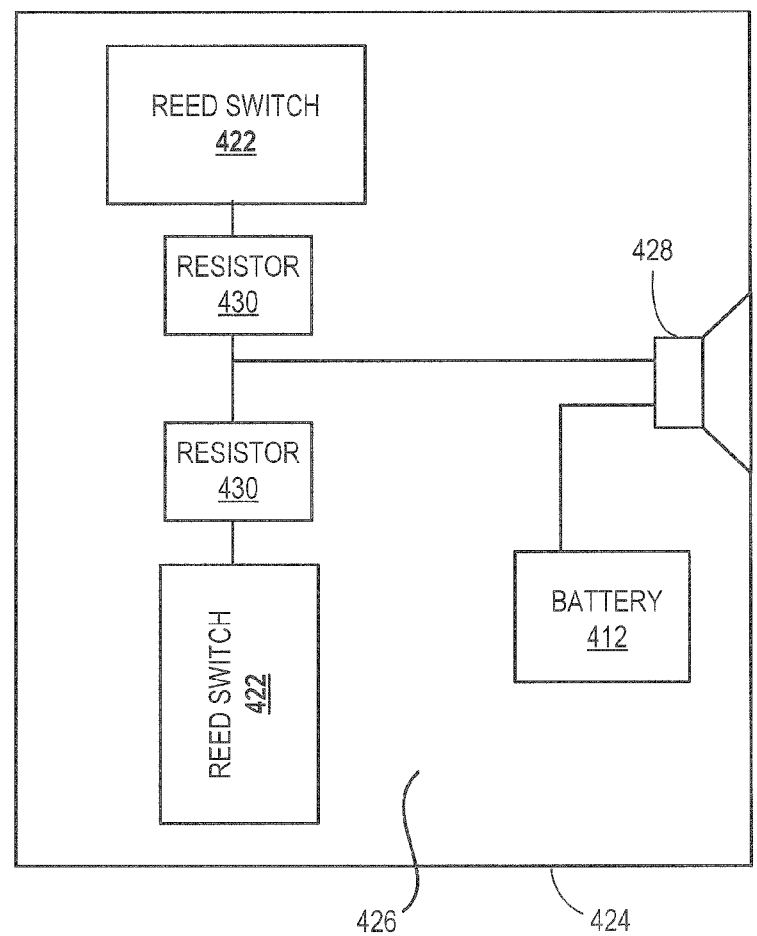
FIG. 5 is a schematic illustration of a magnetic proximity sensor system with internal reed switches.
Figure 5:
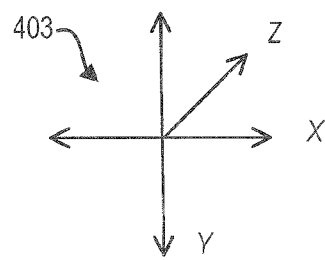

FIG. 5 schematically shows a magnetic proximity sensor system 420, with two modified reed switches 422 for multi-directional sensing of magnetic fields. System 420 includes a housing 424. Housing 424 may be formed from a potting material 426, as described above with respect to sensor system 400, FIG. 4. Potting material 426 is for example a plastic, silicon or other durable material such as potting resin CR 300. Although reed switches 422 do not require power to operate, an on/off switch or button (e.g., button 418) may be provided to conserve battery power (e.g., drain by an included alarm) when system 420 is not in use. In one embodiment, due to the low power requirements of system 420 and to assuage safety concerns, system 420 does not include an on off switch or button, but is constantly powered by the battery. An additional low battery indicator (not shown) such as a light, may also connect with the battery and be visible on or through housing 424. Optionally, external contacts are provided through housing 424 (e.g., as described with respect to FIG. 3A) for connection with an external power source. An "on" indicator, e.g., a green light, may be provided with housing 424, to indicate that the system is properly connected.

Modified reed switches 422 are placed perpendicular to one another, for sensing magnetic fields along x, y and z axes, illustrated by coordinates 403. Each modified switch 422 may be tripped in two axes, thus, two perpendicular switches 422 provide for sensing of magnetic fields along x, y and z axes. A third modified reed switch 422, or a standard reed switch, may be added to sensor system 420 to enhance multi-directional sensitivity.

Modified reed switches 422 are connected to alarm 428, which is powered for example by battery 412. Alarm 428 is triggered upon breach of a magnetic field threshold and completion of a switch 422 circuit. Magnetic field threshold may be engineered into modified switches 422, as described below with respect to FIGS. 6 and 7. Housing 424 may be formed around an outlet or speaker of Alarm 428, or alarm 428 may be broadcast through a separate speaker configured with housing 424 (e.g., speaker 412, FIG. 4). Resistors 430 may be included with switches 422 or as separate components of system 420 that provide connection with alarm 428, where limitation of current through system 420 is desired.

Figure 6A:
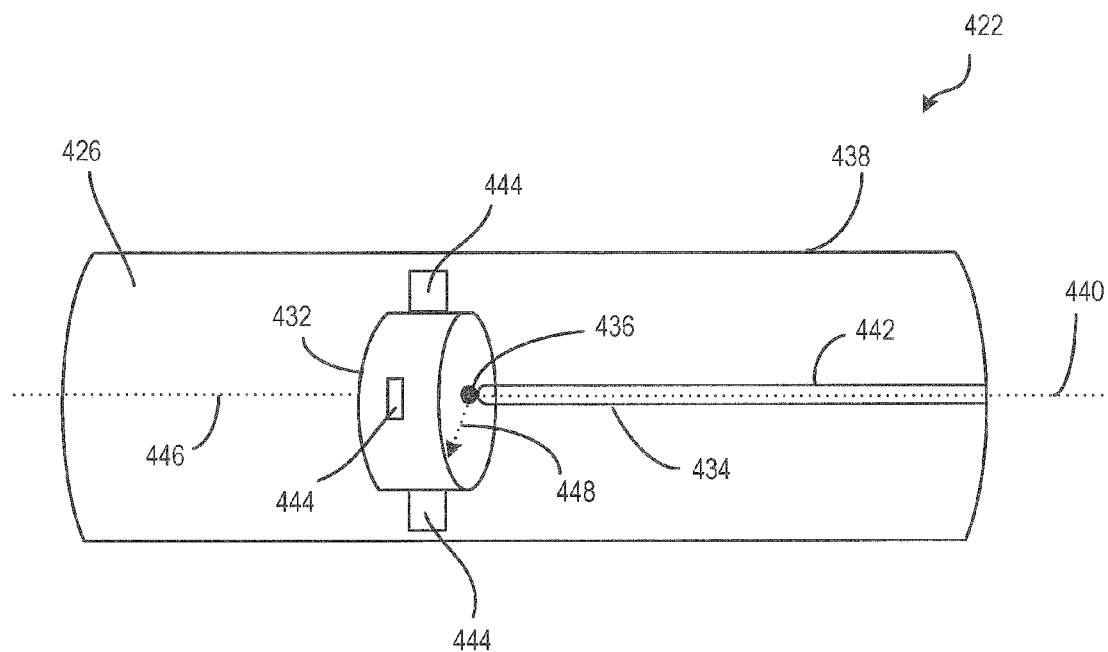
FIG. 6A is a side view of one modified reed switch, for use with the magnetic proximity sensor system of FIG. 5.
Figure 6B:
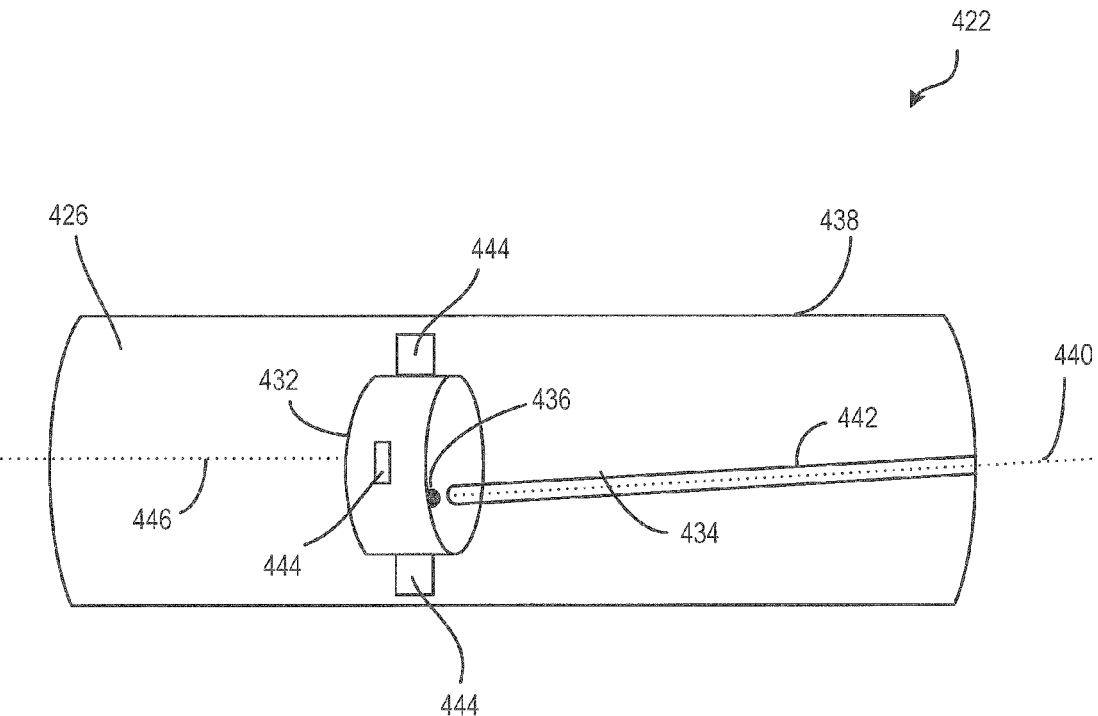
FIG. 6B is a side view of the modified reed switch of FIG. 6A, in closed-circuit position.

FIGS. 6A and 6B are schematic views of one modified reed switch 422. Modified switch 422 includes a circular or hemispheric conductive contact 432 and a magnetic contact 434. An end 436 of magnetic contact 434 is centered within hemispheric contact 432. Magnetic contact 434 may be anchored at its other end by a housing 438 of modified reed switch 422. Housing 438 is for example made of glass. In one embodiment, magnetic contact 434 includes a wire filament 440 within a nonconductive sheath 442, with a ferrous end 436 extending from the sheath. Sheath 442 is for example a stiffening monofilament or polymer that supports the weight of magnetic contact 434, yet flexes to allow contact between ferrpus end 436 and hemispheric contact 432 (and completion of the switch circuit) at an appropriate magnetic field strength or threshold. The magnetic threshold of each switch 422 may be customized by varying strength and/or stiffness of sheath 442, for example by varying sheath 442 composition.

Hemispheric contact 432 is conductive but not magnetic, and is stabilized within housing 438 by one or more supports 444. In one embodiment, hemispheric contact 432 is a copper ring with four extending copper tabs 444 and a connected wire 446. Magnetic contact 434 is supported by a nonconductive polymer sheath 442 with sufficient stiffness to hold wire filament 440 (and ferrous end 436) away from hemispheric contact 432, as shown in FIG. 6A, until an external magnetic field exceeds five Gauss. Once the five gauss threshold is exceeded, magnetic contact 434 is deflected by the external magnetic field, for example in the direction of arrow 448, into contact with hemispheric contact 432, as shown in FIG. 6B, closing the switch circuit. It will be appreciated that reed switch 444 may be deflected, or triggered, along two axes and not solely in the direction of arrow 448.

Reed switch 444 is connected with (e.g., wired to) battery powered alarm 438, optionally via a resistor 430 (see FIG. 4). Completion of the switch circuit (FIG. 6B) triggers alarm 438, which sounds, flashes and/or vibrates to indicate that the threshold magnetic field has been breached. When external magnetic field strength decreases (for example as a practitioner moves a crash cart with an attached sensor 420 away from an MRI machine), force exerted by sheath 442 overcomes the decreasing magnetic field and returns magnetic contact 434 to the open position of FIG. 6A. The stationary nature of hemispheric contact 432 may prevent or reduce contact magnetization, as has been observed with traditional reed switches.

Figure 7A:
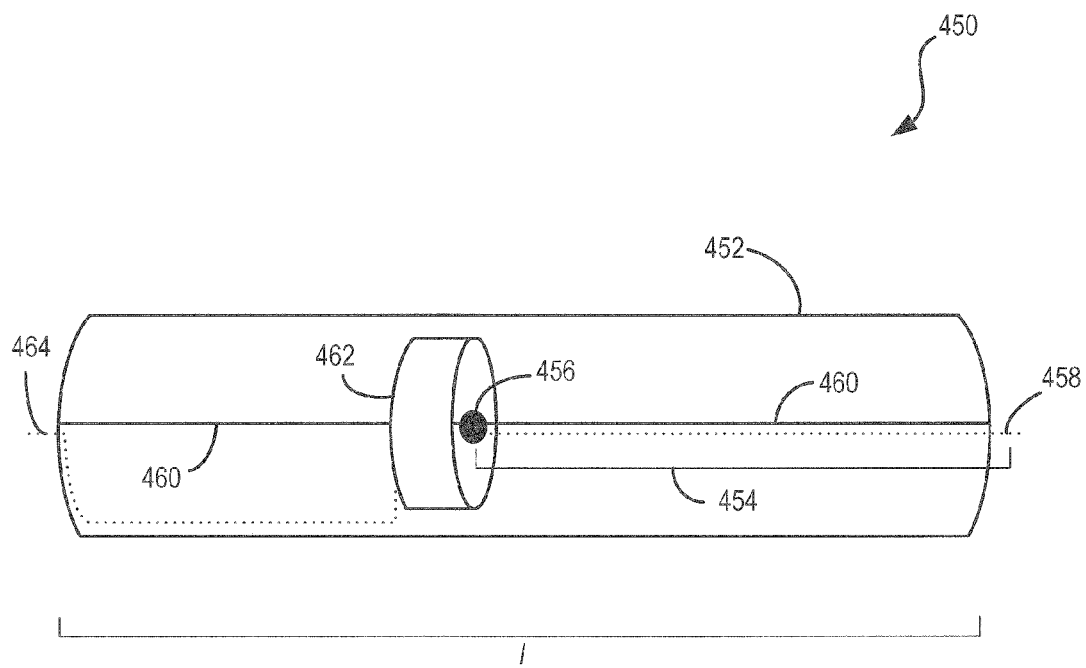
FIG. 7A is a side view of another modified reed switch, for use with the magnetic proximity sensor system of FIG. 5.
Figure 7B:
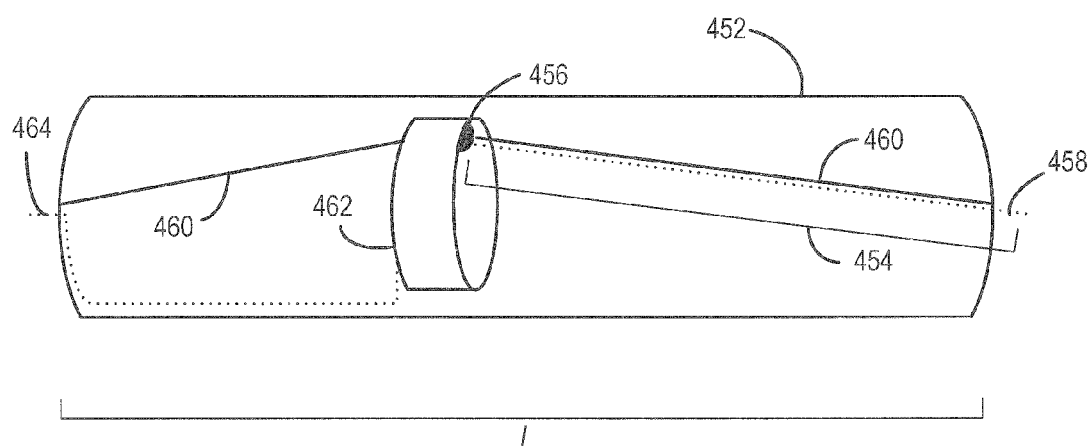
FIG. 7B is a side view of the modified reed switch of FIG. 7A, in closed-circuit position.

FIGS. 7A and 7B are schematic views showing an alternate modified reed switch 450 in open and closed positions, respectively. Modified switch 450 has a housing 452 encasing a magnetic contact 454. In one embodiment, magnetic contact 454 is a ferromagnetic contact with a ferrous contact end or bead 456 on a wire 458. Housing 452 is for example made of glass. Ferromagnetic contact 454 is supported by a stiffening monofilament or monofilaments 460 that connect with bead 456 and extend the length l of modified switch 450. Ferromagnetic contact 454 is positioned such that ferrous bead 456 is centered at a diameter of hemispheric contact 462 when switch 450 is open (FIG. 7A). Hemispheric contact 462 is a conductive, non-magnetic material, such as copper, with a connected wire 464. As with hemispheric contact 432 of FIGS. 6A and 6B, hemispheric contact 462 may include one or more supports (not shown) to secure it within housing 452. Alternately, housing 452 may be formed with a recess and/or extrusions to hold hemispheric contact 462 in place.

Modified switch 450 has a magnetic threshold that is for example governed by the strength or stiffness of monofilament(s) 460. When switch 450 is in the presence of a magnetic field powerful enough to overcome the stiffening properties of monofilament(s) 460, ferromagnetic contact 454 bends, flexing monofilament(s) 460, to contact hemispheric contact 462 and close the switch circuit, as shown in FIG. 7B. It will be appreciated that as with switch 422, switch 450 may be triggered, or ferromagnetic contact 454 bent, along two axes. When the magnetic field affecting switch 450 decreases, for example as a sensing system incorporating switch 450 is moved away from an MRI machine or other magnetic source, the stiffening properties of monofilament(s) 460 aid in returning ferromagnetic contact 454 to its original, or open position (see FIG. 7A).

Figure 8:
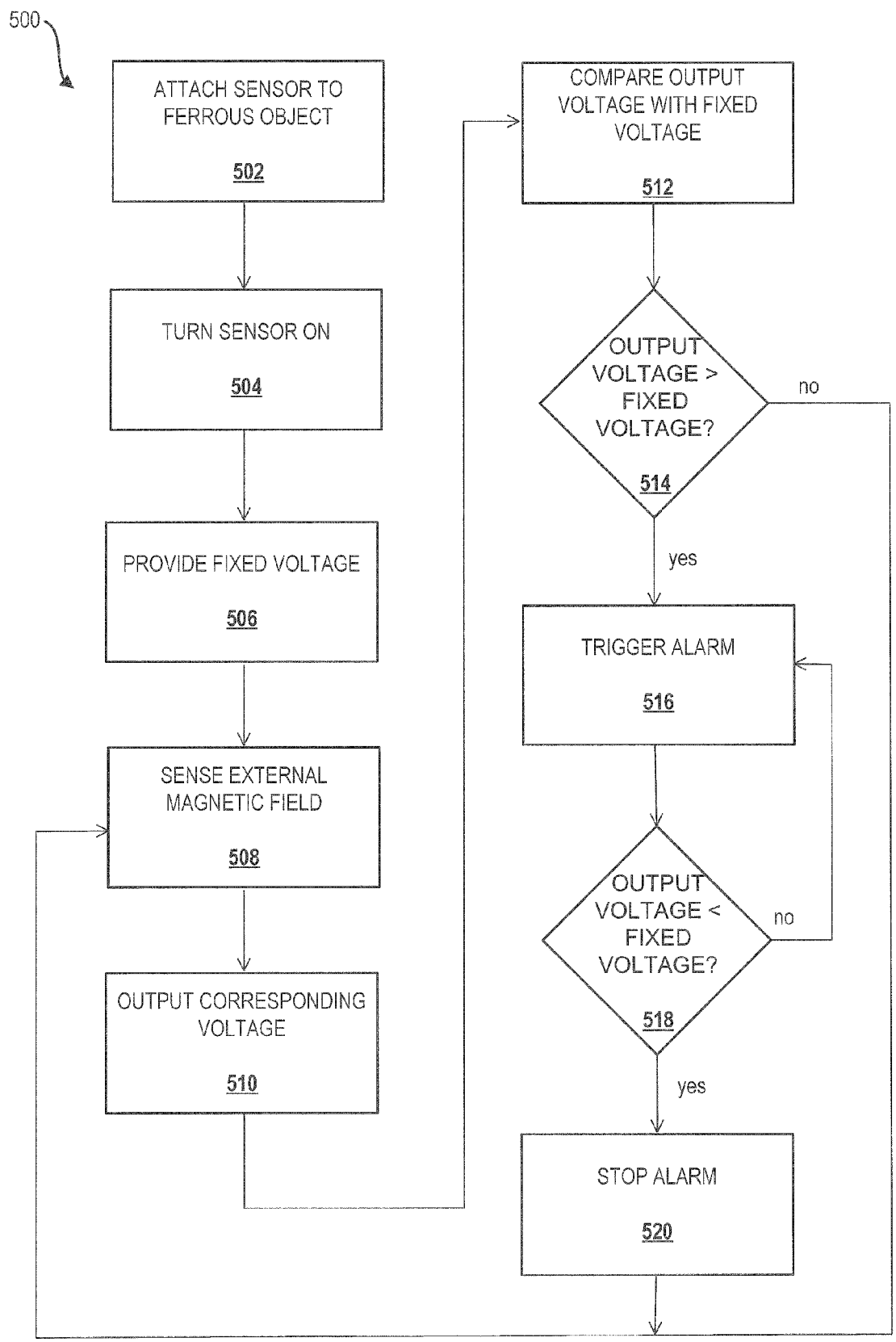
FIG. 8 is a flowchart illustrating one method of detecting a magnetic field using a magnetic proximity sensor system of FIGS. 1-4.

Exemplary use of the above-described magnetic proximity sensor systems 100-400 is illustrated in the flow chart of FIG. 8. Exemplary use of a magnetic proximity sensor with modified reed switches, e.g., system 420, is illustrated in the flow chart of FIG. 9.

In particular, FIG. 8 depicts a method 500 for detecting a magnetic field using one of such magnetic proximity sensor systems. The magnetic proximity sensor system is attached to a metal (e.g., ferrous) object, in step 502. If an on/off switch, power button or other input is provided, the magnetic proximity sensor system is turned on (e.g., via switch 418, FIG. 4), in step 504. In an example of steps 502, 504, system 400 is attached to a mobile ferrous object such as a clipboard, crash cart or oxygen tank, and turned on.

A fixed voltage corresponding to a threshold magnetic field strength is provided, in step 506. An external magnetic field is sensed, in step 508, and translated into an output voltage, in step 510. The output voltage is compared with the fixed voltage, in step 512. In an example of steps 506-512, potentiometer 404 provides a fixed voltage. Potentiometer 404 is for example set to generate a fixed voltage corresponding to a five Gauss magnetic field. Magnetic field sensors, e.g., Hall effect sensors 402, continually or periodically sense magnetic field strength around the ferrous object and the magnetic proximity sensor. As the object is moved toward an operating MRI scanner, for example, the magnetic field output by the scanner increases in strength. Hall effect sensors 402 output a voltage corresponding to the sensed magnetic field strength. Comparators, e.g., comparators 408, compare the output voltage with the fixed voltage provided by potentiometer 404.

If the output voltage exceeds the fixed voltage (e.g., the external magnetic field exceeds the threshold magnetic field), decision 514, an alarm is triggered, in step 516. In an example of steps 514, 516, if the output voltage from Hall effect sensors 402 exceeds the fixed voltage from potentiometer 404, an alarm, e.g., alarm 406, is triggered and generates an alarm signal to alert personnel that the ferrous object has passed the five Gauss magnetic threshold, or safe point. If the external magnetic field weakens, e.g., the output voltage falls below the fixed voltage, decision 518, then the alarm stops, in step 520. In an example of steps 518, 520, the ferrous object is moved away from the MRI scanner such that the voltage output by sensor 402 drops below the fixed voltage provided by potentiometer 404. When the fixed voltage exceeds the voltage output by sensor 402, alarm 406 stops generating the alarm signal.

Figure 9:
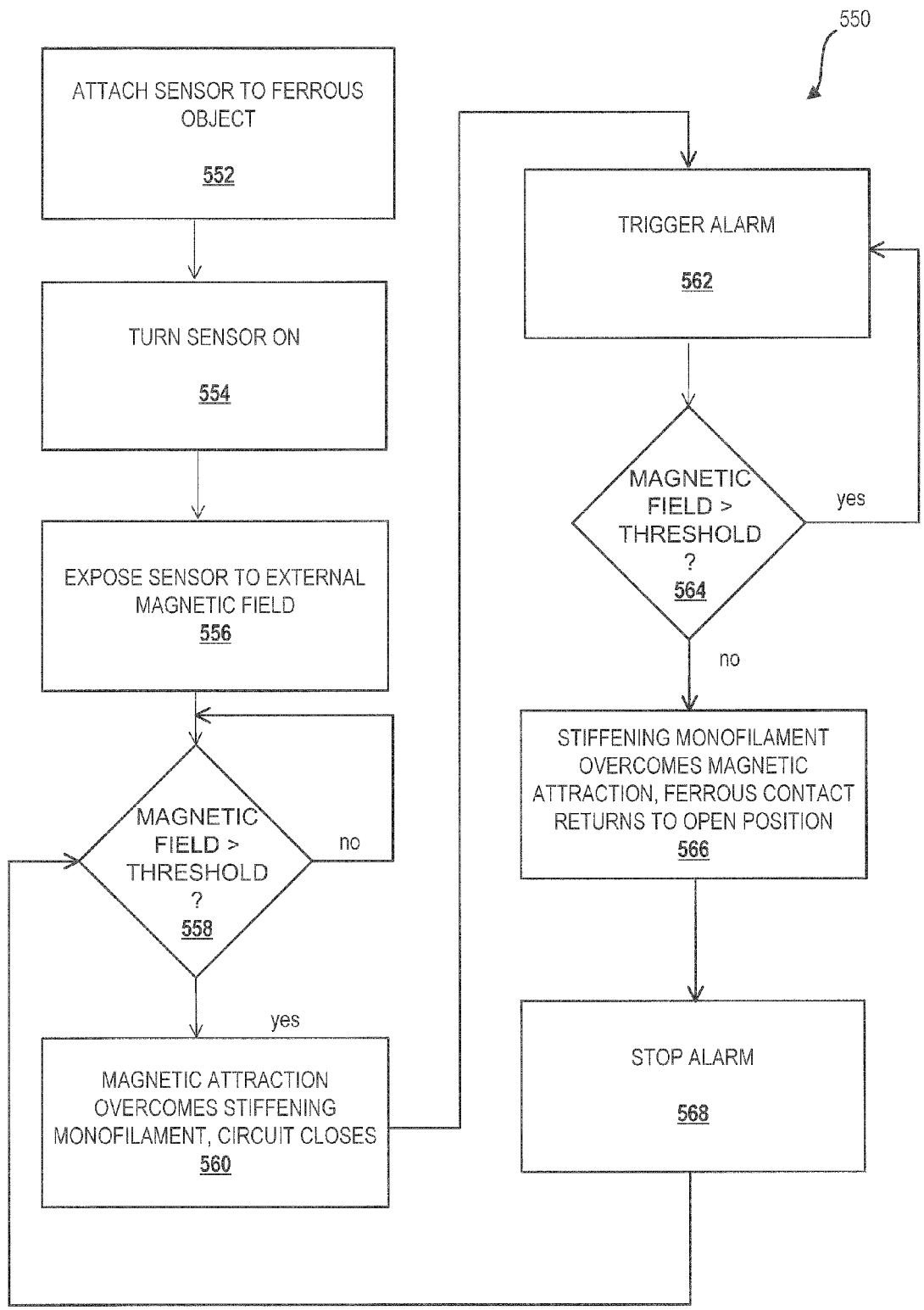
FIG. 9 is a flowchart illustrating one method of detecting a threshold magnetic field strength using a magnetic proximity sensor with the modified reed switches of FIGS. 6A-6B and/or 7A-7B.

FIG. 9 is a flowchart depicting a method 550 of sensing a threshold magnetic field using a sensor with modified reed switches, e.g., as described with respect to FIGS. 5, 6A-7B.

The sensor is attached to a ferrous object and turned on, in steps 452, 454. The sensor is exposed to a magnetic field, in step 456. In one example of steps 452-454, an MRI tech clips, sticks or otherwise fastens the sensor, e.g., sensor 420, FIG. 5, to a clipboard and brings the clipboard into an MRI suite. If the external magnetic field, for example generated by the MRI scanner, exceeds a threshold magnetic strength, decision 558, magnetic forces acting upon a ferromagnetic contact within a modified reed switch overcome stiffening properties of a monofilament or polymer supporting the ferromagnetic contact, and the contact is deflected by (bends toward or away from) the magnetic field, and closes a switch circuit, in step 560. In one example, external magnetic forces exert sufficient pull or push upon ferrous contact 434 to bend the contact and flex supporting sheath 442. Ferrous end or bead 436 contacts hemispheric contact 432 to close the circuit.

Closing of the circuit triggers an alarm, in step 562, which continues while the external magnetic field exceeds the threshold field strength, decision 464. Once the external field is less than the threshold strength, decision 464, the stiffening properties of the monofilament or polymer overcome magnetic attraction or repulsion of the ferrous contact, the ferrous contact returns to its original position, and the circuit opens, in step 566. The alarm stops, in step 568. In one example of steps 562-568, an audible, visible and/or tactile alarm 428 sounds when the circuit closes, in step 560. The above-mentioned MRI tech notes the alarm and moves the clipboard and the attached sensor 420 away from the MRI scanner. Once the sensor and clipboard are sufficiently far from the scanner that its magnetic forces fall below the sensor 420 threshold, pull exerted due to the stiffness of supporting sheath 442 overcomes magnetic forces acting upon ferrous contact 434, and returns contact 434 to its original, open position. Opening of the switch circuit stops alarm 428. Once the sensor, e.g., sensor 420 is turned off, alarm 428 will not operate, even though modified reed switches may continue to react to external magnetic fields.

Experimental Results

MRI machines serve as a major money making department of modern hospitals often grossing millions of dollars each year. In order to establish a basic understanding of the economics in the MRI department of a hospital, extensive interviews of various hospitals were conducted.

Hospitals in the United States and Europe (ranging in size from over a thousand in-patients to under one hundred) were interviewed to determine current MRI statistics such as average number of MRI patients, average number of MRI employees (doctors and staff), number of MRI units, standard safety precautions, including number of safety scanning checks, and staff/doctor time spent in screening patients prior to MRI procedures. Select results of these interviews are presented in Tables 1A and 1B, below.

TABLE 1A

Hospital Interviews: United States
Hospital Interviews: United States

| Hospital/Location | Number MRI units | Patients/Day | Number Working in MRI | Number Doctors | Number of Techs | Who is involved with the screening process |
|---|---|---|---|---|---|---|
| Penobscot Bay Rockport, ME | 1 | 17.5 | 2 | none employed | 2 per shift; travel with the MRI | questionnaire with tech before entering room |
| Cooley Dickenson Northhampton, MA | 1 | 22 | 11 | 7 | 4 | 2 screenings; 1 questionnaire over the phone and 1 screening on site |

TABLE 1A-continued

Hospital Interviews: United States

| Hospital/Location | Number MRI units | Patients/Day | Number Working in MRI | Number Doctors | Number of Techs | Who is involved with the screening process |
|---|---|---|---|---|---|---|
| St. Vincent's NY, NY | 1 | 21 | 9 | 6 per shift | 3 per shift | form with receptionist; screening by tech |
| Holy Cross Silver Spring, MD | 1 | 15 | 7 | 4 | 3 | questionnaire with 1 tech; interview with another tech |
| Archbold, M.C Thomasville, GA | 1 | 20 | 7 | 4 | not provided | questionnaire in waiting room; re-interview by tech before entering MRI |
| Florida Kissimmee, FL | 1 | | 4 | contract out to radiologists | 4 | tech screens patient |
| Memorial Medical Center Springfield, IL | 2 | 27 | 8 | staff radiologists (40) | 6 | Checklist; interviewed by 1 tech |
| Forest Park St. Louis, MO | 1 | not provided | 4 | staff radiologists | 4 | first screening with receptionist; review check sheet with tech |
| Mercy Iowa City, IA | 2 | 27.5 | 16 | 10 | 6 | desk assistant screens, patients fills out form, then tech interviews patient |
| Naval Medical San Diego, CA | 2 | 18 per scanner per day | | | | clerk checks questionnaire and consults with tech before entering MRI |
| Methodist Memphis, Tennessee | 2 | 30 | 5 | staff radiologists | 10 total - 4 per shift | tech goes over questionnaire (10 mn) |
| MA General Boston, MA | 6 | 65 | | staff radiologists | 11 per week day shift | two screenings once patient arrives |
| Providence Anchorage, Alaska | 2 | 60 | 16 | 6 | 9 | tech goes over 1 questionnaire per patient (5 min) |
| Swedish Medical Center Seattle, WA | 1 | 15 | 11 | 4 + staff radiologists | 7 | tech goes over questionnaire; different sheets for in patient/ER patient/out patient (10 min) |
| University of Wisconsin Madison, WI | 4 | 35 | 16 | Staff Radiologists read the images | 13 | nurses screen then tech screens patients |
| St. John Detroit, MI | 1 | 25 | 5 | Staff Radiologists read the images | 5 | techs screen in; in-patients screened by nurses then again by techs. |
| Riverside Memorial Columbus, OH | 5 | 50 | 32 | staff radiologists | 12 specialized MRI and 22 techs | MRI history screening - Tech goes over questionnaire |
| Washoe Health Reno, NV | 2 | 30 | 13 | radiologist on contract | 10 | triple check system - 1 questionnaire; 1 check sheet with nurse; final check sheet with tech |
| Methodist Houston, TX | 1 (perm. mobile) | 80 | 10 | staff | 8 to 10 | safety questionnaire must be signed by two people who review - sometimes 2 techs or 1 nurse 1 tech (10 mn) |
| Presbyterian Hospital Dallas Dallas, TX | 4 | 80-90 | 10 | 2 groups of staff radiologists; (body MRI and head MRI) | 8 day/8 night/ 7 weekend | tech; a whole department that screens the patients; nurse and tech screenings |
| Maui Memorial Medical Center Wailuku, HI | 1 | 15-25 | 5 | Staff | 4 technologists | Dr.; receptionist; last screening by techs (10 mn) |
| DHMC Lebanon, NH | 3, 1 is mobile | 55-65 (with mobile unit) | 7 | staff | 6 per shift | safety sheet; techs screen before going into MRI (~10 mn) |

TABLE 1A-continued

Hospital Interviews: United States

| Hospital/ Location | Number MRI units | Patients/Day | Number Working in MRI | Number Doctors | Number of Techs | Who is involved with the screening process |
|---|---|---|---|---|---|---|
| Garrison Memorial Garrison, ND | 1 | not given | 6 | staff radiologists read images; 1 main radiologist does MRI | 1 travels with MRI; hospital techs help if needed. | traveling tech does final screening |
| Camp Pendleton Camp Pendleton, CA | 1 | 21 (T-F) each week | 5 | staff radiologists read the images | 2 - come with MRI unit | screened by 1 tech |
| Scotland County Memphis, MO | 1 | 6 (every Tues.) | 4 | 1 staff doctor | 3 come with MRI | screened by 1 tech with a questionnaire |
| Jefferson County Fairfield, IA | 1 | 4-7 (there one day a week) | 1 DR and 2 techs - provided by MRI co. | 1 radiologist from hospital | None from hospital - 2 with MRI | tech and assistant - tech finalizes interview before patient is imaged. |

TABLE 1B

Hospital Interviews: Europe, Australia and New Zealand

| Hospital/ Location | Number MRI units | Patints/day | Number Working in radiology | Number Doctors | Number Techs | Number Nurses | Who is involved with the screening process? |
|---|---|---|---|---|---|---|---|
| Queen Elizabeth II Halifax, Nova Scotia | 2 | 30 | 3 | 1 | 2 | 0 | Tech screen questionnaire - patients walk through metal detector, but the metal detector is not used because of its sensitivity. Metal detector is about 9 years old. |
| Canadian Diagnostic Center Halifax, Nova Scotia | 1 | 15 | 3 | 1 | 2 | 0 | Techs screening questionnaire (standard) 10 mm procedure - refer to Frank Shellock's book on MRI |
| Mater Misericordiae Dublin, Ireland | 1 | 12 to 15 | 4 | 1 | 3 | 0 | Tech screening questionnaire - sometimes make patients remove clothing to increase resolution - have a metal detector - don't use it - it is not efficient - too sensitive |
| Balfast City Belfast, N. Ireland | 1 | 45/wk | 5 | Staff radiologists | 4 | 0 | Tech screening questionnaire on phone and when they come in |
| Western General Edinburgh, Scotland | 2 1-clinical 1-research | 30/day | 5 | 1 | 4 | 0 | Tech screening questionnaire - also use magnet to check ferromagnetism |
| St. Michaels Toronto, Canada | 2 getting a 3 | 40 | 7 | staff radiologists | 6 | 0 | Tech screening questionnaire (10 mn) |
| St. Thomas London, U.K. | 2 | 30 | 8 | Staff radiologists | 6 | 0 | Tech screening questionnaire (10 mn) |
| University London, U.K. | 2 | 20 | 6 | 2 | 4 | 0 | Tech screening Questionnaire - metal detectors are useless - tried one did not like it - too sensitive |
| Middlesex London, U.K. | 1 | 20 | 6 | 2 | 4 | 0 | Tech screening questionnaire - magnet to check ferromagnetism of objects |
| Derby Royal Infirmary Derby, U.K. | 1 | 30 | 5 | 10 Radiologist Staff | 4 | 0 | Tech screening questionnaire - magnet to check ferromagnetism of objects |

TABLE 1B-continued

Hospital Interviews: Europe, Australia and New Zealand
Hospital Interviews: Europe, Australia and New Zealand

| Hospital/Location | Number MRI units | Patints/day | Number Working in radiology | Number Doctors | Number Techs | Number Nurses | Who is involved with the screening process? |
|---|---|---|---|---|---|---|---|
| Southern General Glasgow, Scotland | 1 | 10 | 4 | Staff radiologists | 3 | 0 | Tech screening questionnaire (10 mn); problems with a buffer accelerated into MRI quenched magnet |
| DGH Royal Shrusberry Wales | 1 | 15/ visit wk | 3 | 1 | 2 | 0 | Tech screening questionnaire (10 mn) |
| St. Vincent's Melbourne, Australia | 3 | 40-50 | 13 | Staff radiologists | 10 | 1 | Tech screening questionnaire - MRI technologist/nurse (10-15mn); no metal detectors (waste of time, too sensitive). Shellock says the detectors are inefficient. Conferences in US and Australia |
| Royal Perth Perth, Australia | 1 | 18-20 | 7 | Staff radiologists | 3 | 3 | Tech screening questionnaire with nurse then again with radiographer. Used metal detector less than a month - too sensitive, inefficient. Use magnet to test ferromagnetism - if the inpatient may have metal but doesn't know or if patient is unable to be interviewed, xrays are used to check |

As shown in Tables 1A and 1B, a considerable amount of employee time is typically used in conducting multiple screening checks required by MRI facilities. In addition to these checks, MRI practitioners must take great care that no ferrous materials come close enough to the MRI scanner to be drawn into the bore of its magnet. Many MRI facilities use walk-through or other metal detectors at the entrance to an MRI suite. However, neither screenings nor metal detectors address the problems posed by metal (especially ferrous) objects that must be brought into proximity with a strong magnet, such as that used in an MRI scanner. The magnetic proximity sensor systems disclosed herein presents a solution to this problem. By attaching the magnetic proximity sensor system to ferrous objects that must be brought proximate the magnet, practitioners can be alerted when the ferrous object crosses a threshold "safe zone" of magnetic field strength.

Magnetic Proximity Sensor System Development and Test Results

The components considered and tested in developing one Magnetic Proximity Sensor system include:
  National Semiconductor LM139/LM239/LM3339/LM2901/LM3302 Low Power Low Offset Voltage Quad Comparators;
  National Semiconductor LM111/LM211/LM311 Voltage Comparators
  Texas Instruments TLC372, TLC372Q, TLC372Y LinCMOS Dual Differential Comparators
  Texas Instruments JG (R-GDIP-T8) Ceramic Dual-in-line
  Texas Instruments U (S-GDFP-F10) Ceramic Dual Flatpack
  Texas Instruments FK (S-CWCC-N) Leadless Ceramic Chip Carrier
  Texas Instruments P (R-PDIP-T8) Plastic Dual-in-line
  Texas Instruments D (R-PDSO-G) Plastic Small-outline Package
  Texas Instruments PS (R-PDSO-G8) Plastic Small-outline Package
  Texas Instruments PW (R-PDSO-G) Plastic Small-outline Package
  Copal Electronics Surface Mount Type Trimmers SM-4
  Axson Epopast 206
  Melexis MLX90215 Precision Programmable Linear Hall Effect Sensor
  Honeywell SS490 Series Hall Effect Sensors
  Honeywell 2SS52M Series Digital Magnetoresistive Sensors
  Honeywell HMC1023 3-Axis Magnetic Sensor
  Honeywell SR16/17 Hall Effect Vane Sensors
  Optek Hallogic® Hall Effect Sensors Types OHN3410U, OHS3140U, OH090U
  Panasonic Hall ICs DN6849/SE/S
  COTO Technology RI-80 SMD and RI-70 Series Dry Reed Switch Sensors Along with other analog sensors, both Reed switches and Hall effect sensors were investigated to determine their efficacy in detecting magnetic fields. Using an analog sensor allows for setting the sensor to detect a particular magnetic field Tested sensors include:

TABLE 2

Sensors tested for Magnetic Proximity Sensor

| Company | Sensor |
|---|---|
| Melexis | Linear Hall Effect Sensor MLX90215 LC03 MLX90215LVA-LC03-ND |
| Honeywell | 3-Axius Magnetic Sensor Hall Effect Sensor SS495B |

TABLE 2-continued

Sensors tested for Magnetic Proximity Sensor

| Company | Sensor |
|---|---|
| TT Electronics/OPTEX Technology (sold by DigiKey) | Hall Effect Sensor 365-1003-ND |
| | Hall Effect Sensor 365-1001-ND |
| | Hall Effect Sensor 296-10311-5-ND |
| Panasonic | Hall Effect Sensor DN6849S-ND |
| Coto Technology | Reed Switch R-170 |

Reed Switches

Testing of a prototype sensor and reviewing information about conventional reed switches indicated that reed switches may require modification for placement in a magnetic proximity sensor system. The metal contact plates inside the reed switches' glass casings can become magnetized by an MRI field, causing the alarm to sound even when removed from the magnetic field, or alternately, causing the alarm to stop sounding when returned to a magnetic field. The switches also proved fragile, non-resilient to bumps and tampering and ineffective for radial sensing.

The modified reed switch described above with respect to FIGS. 6A-7B may overcome these drawbacks. The single ferromagnetic contact described with respect to switches 422, 450, may reduce magnetization of the switch. The stiffening monofilament(s) or polymer(s) described above support and protect the ferromagnetic contact, and aid in returning the ferromagnetic contact to its original position upon appropriate reduction in an external magnetic field.

A Hall Effect Sensor generates an analog output voltage proportional to magnetic flux perpendicular to the magnetic field. This effect is created by passing an electrical current through the sensor while it is in the presence of a magnetic field.

A variety of Hall Effect sensors were tested, including those listed in Table 2. Single-direction Hall Effect sensors were first tested; and helped lay the circuit foundation for a prototype sensor system. Giant Magneto-Resistive Position Sensors were also tested, but exhibited higher sensitivity than needed for the Magnetic Proximity Sensor system (e.g., triggered and stopped the alarm at a Gauss level above the five Gauss default).

Magnetoresistive Position Sensors were likewise tested. When used in conjunction with an additional circuit amplifier, to maintain high voltage, these sensors may accurately detect the desired Gauss level; however, this adds to the overall size. Thus, magnetoresistive position sensors may be suitable in applications where the smallest possible device is not required. The 3-Axis Magnetic Sensor (HMC1023) was likewise tested; however, its higher cost may be prohibitive in some applications.

Bipolar Hall sensors (such as the Melexis' Linear Hall Effect Sensor MLX90215 LCO3) were found to provide accurate sensing in the x, y and z planes with three sensors, instead of six. This allowed for an overall smaller magnetic proximity sensor system that effectively detected and triggered the alarm at the five Gauss default level.

Alarm Buzzers

Decibel levels at various locations in an MRI department were measured to determine how loud the alarm buzzer must be to be heard over ambient noise. Tests were conducted in the MRI Department of Dartmouth-Hitchcock Medical Center, with the following results:

TABLE 3

Decibel Levels in MRI Facilities

| Location/Activity | Sub-location In Room | Readings (dB) |
|---|---|---|
| MRI Room During Imaging | Near Door | 78 |
| | Right of MRI Bench | 80 |
| | Left of MRI Bench | 79 |
| | End of MRI Bench | 80 |
| Average for MRI Room During Imaging | | 79.3 |
| MRI Room, Ambient Noise | Near Door | 58 |
| | Right of MRI Bench | 58 |
| | Left of MRI Bench | 60 |
| | End of MRI Bench | 57 |
| Average Ambient Noise for MRI Room | | 58.3 |
| Hallway of MRI, Ambient Noise | Near Door | 58 |
| | In Control Room | 58 |
| | In Control Room | 57 |
| | Outside Control Room | 57 |
| Average Ambient Noise for MRI Hallway | | 57.5 |
| Patient Waiting Room, Ambient Noise | Near Door | 57 |
| | Right of MRI Bench | 58 |
| | Left of MRI Bench | 58 |
| | End of MRI Bench | 57 |
| Average Ambient Noise for Waiting Room | | 57.5 |

The Radio Shack 12VDC Piezo Mini Buzzer 273-074 provided an effective decibel output of 87.5 dB (louder than a typical household vacuum, which measures about 80 dB) and fit well into the size constraints of the Magnetic Proximity Sensor. Its range of 3.0-16V matched the voltage requirements of the Hall effect sensors. The test results provided in Table 3, indicate that the buzzer is significantly louder than the ambient noise of the MRI facility. At about 30 decibels higher than the ambient noises the buzzer is approximately to the power of 6 times the intensity of the ambient noise, loud enough to alert medical personnel to a problem if used in this facility.

As shown above, the MRI room during imaging has an average reading of 79.3 dB, which is much closer to the decibel level of the alarm buzzer. During the imaging process there should be no traffic into or out of the MRI room. It is unlikely that the magnetic proximity sensor would be used during the imaging process, as the door to the MRI suite would generally be closed and locked. However, in the unlikely event that the sensor is used during imaging, it is still almost 10 dB louder than the noise floor during imaging.

Potentiometers

Where Hall effect sensors are used, potentiometers may be required to create reference voltages sufficient to set off the alarm. Various potentiometers, including the Spectral 50K 43 P503 and the 10K Bourns 3262, were tested to see which created reference voltages sufficient to set off the tested buzzers at five Gauss.

The 10K Bourns 3262 Trimming Potentiometer, also known as a variable resistor, can be set by a user to a desired specific voltage. The potentiometer is also adjustable and can be changed when using different power supplies. Observation that the Hall sensors tested above had two outputs (one negative and one positive) and voltage measurements from these sensors indicated that two potentiometers would serve to provide fixed voltages. One potentiometer is for example set to provide a voltage corresponding to positive five Gauss and another set to provide a voltage corresponding to negative five Gauss.

Comparators

Comparators were used to check voltages from the sensors and compare the voltages to the set voltage of the variable resistors/potentiometers. The comparators for example compare the voltages to actuate the alarm buzzer(s). Single chip to quad comparators used in the development of this device include:

TABLE 4

Comparators tested for Magnetic Proximity Sensor

| Company | Comparator Type/Size | Name/Part No. |
|---|---|---|
| National Semiconductor | single comparator chip, size = 0.785 × 0.310 in. | LM311 |
| National Semiconductor | quad (four) comparator chip size = 0.785 × 0.310 in. | LM339 |

Simple conversions indicated that the magnetic proximity sensor usefully provide at least ten millivolts per Gauss. In testing the comparators, the Hall sensors were for example set at five Gauss and the comparators observed to detect fifty millivolts of change in the circuit voltage (which corresponds to 2.42V and 2.52V ((±5) Gauss).

The LM311 was first used in the prototype circuit; however, the LM339 was later adopted, for reasons of space conservation. The LM339 provides four comparators in a chip the same size as the one-comparator LM311. In addition to being designed to operate from a single power supply, the LM339 comparators have a low power drain.

Capacitors

Because Hall Effect sensors were set based on input and output voltages, capacitors were tested for their ability to minimize voltage variances in the circuit. Both μ10 farad and 0.1μ farad capacitors helped regulate voltage across circuit components, and were used in the final prototype.

Potting Material

The Rockwell hardness test was performed to assess the basic strength and resistance of silicon-type Epopast 206 and potting resin CR 300, in order to determine if they would function in a hospital environment. The Rockwell hardness test measures the bulk hardness of metallic and polymer materials, and correlates with strength and wear resistance. Rockwell Scale R, along with the ½ ball bit, was used to test the samples, with the following results:

TABLE 5

Results of Hardness Testing

| Material | Test 1 (HRR) | Test 2 (HRR) | Test 3 (HRR) | Test 4 (HRR) | Test 5 (HRR) | Test 6 (HRR) | Avg. (HRR) |
|---|---|---|---|---|---|---|---|
| CR-300 (potting resin) | 12.7 | 14.3 | 13.2 | 12.0 | 12.2 | 12.8 | 12.87 |
| Epopast 206 (silicon) | too soft for these tests | | 0 | 0 | 0 | 0 | |

Because the CR-300 Resin proved to be more resistant to wear and tear, it was chosen as the potting material for the Magnetic Proximity Sensor system prototype.

Prototype Components and Testing

Prototype Components

IC and surface mount prototype Magnetic Proximity Sensor systems were built using the following components:
Melexis Linear Hall Effect Sensor MLX90215 LCO3
Radio Shack 12VDC Piezo Mini Buzzer 273-074
10K Bourns 3262 Trimming Potentiometer
LM339 four-comparator chip
10 μF capacitor
0.1 μF capacitor
potting resin CR 300
Radio Shack Alkaline 6 Volt Battery (see "Batteries" subheading, below).

Batteries

Theoretical calculations were made to determine whether the prototype Magnetic Proximity Sensor system could be powered by EMF from an MRI machine, alone. Using Faraday's Law, we calculated the flux of a field that is the line integral of the magnitude of the field multiplied by the area of the coil moving through the field, according to Equation 1:

$$\frac{dI}{dt} = \frac{dB}{dt}A + \frac{dA}{dt}B. \quad \text{Eq. 1}$$

Because only one turn is being considered the equation becomes:

$$\frac{dI}{dt} = \frac{dB}{dx} \cdot \frac{dx}{dt}A. \quad \text{Eq. 2}$$

The change in magnitude of the field divided by the distance over which the field changes may be calculated by:

$$\frac{dB}{dx} = \frac{(o - 0.0003)T}{6.5 \text{ m}}, \quad \text{Eq. 3}$$

while velocity of the coil is found by:

$$\frac{dx}{dt} = \frac{1 \text{ m}}{2 \text{ sec}}. \quad \text{Eq. 4}$$

Area of the coil is for example 0.000314 m².

The EMF was calculated using the above equations and values. By substituting the dI/dt value into the following equations 5-7 relating EMF, resistance and current, power generated by the movement of the coil was determined.

$$i = \frac{EMF}{R_C + R_L} = \frac{7.25 * 10^{-8} (v * m)}{2R_C(\Omega)} \quad \text{Eq. 5}$$

$$\text{Power} = EMF * I; \quad \text{Eq. 6}$$

and $$R_c = (1.69 \times 10^{-8}) * \frac{(2\pi(r))}{\pi r^2} = 3.38 \times 10^{-6} \Omega/m. \quad \text{Eq. 7}$$

In order to obtain the greatest power $R_C$ and $R_L$ were set equal to each other. $R_C$ stands for the resistance of the cooper coil and $R_L$ is the resistance of the load, which allows the power to be removed from the coil. The resistance of copper wire is $1.69\times10^{-8}$ $\Omega$*m. Therefore the final equation for power used was:

$$P = \frac{V^2}{4R_C} = \frac{7.25*10^{-8}\,(v*m)}{1.352\times10^{-5}\,\Omega/m}. \qquad \text{Eq. 8}$$

Substituting our values we obtain Power=0.00536 amps/s

The power required to run one prototype Magnetic Proximity Sensor system was calculated at about 0.02 V/s, using:

$$P=\text{Volts*Current} \qquad \text{Eq. 9.}$$

This suggests that the prototype Magnetic Proximity Sensor system requires a power source in addition to the magnetic field of the MRI machine. The type of power source used for the Magnetic Proximity Sensor is important, for example because calibration of Hall effect sensors relies on the voltage through the circuit. Batteries ranging from various sized 3-volt coin cells to a small 6-volt alkaline battery were evaluated, including:

TABLE 6

Batteries tested for Magnetic Proximity Sensor

| Company | Type | Name/Part No. |
|---|---|---|
| Radio Shack | Lithium 3 Volt Coin | CR2032CR2032 |
| | | CR2450 |
| | | CR1216 |
| Radio Shack | 6 Volt Alkaline | 23-469 |

We found that the coin cell did not function at the correct voltage to support the Hall sensors, and thus focused on the alkaline battery. The 6-volt alkaline was in the voltage range required by the Melexis Hall effect sensors and small enough to fit into the mold for the device. Thus, the Radio Shack 6 Volt Alkaline 23-469 was incorporated into the prototype Magnetic Proximity Sensor system.

Prototype Testing

The prototype system was tested for sensing for radial sensing ability and for overall durability, shielding and accuracy.

Radial Sensing Tests

One of the key specifications of the MRI Gauss Detection Device is the ability to accurately sense a magnetic field in all directions, (x, y, z). Three-dimensional sensing was achieved by using three Hall effect sensors, one along each of the x, y and z axes. In order to ensure device accuracy, and to determine sensing capabilities and consistency of buzzer output, the prototype was tested every $\pi/6$ radians over a unit circle in the xy plane and the xz plane. The average distance from the center of the magnet with a field strength of five Gauss was 10.5 centimeters. The device was moved over the circle with a radius of 10.5 cm. At every $\pi/6$, the Gauss reading and the decibel output of the device was recorded. Table 7, below, illustrates the angles at which radial sensing was tested.

TABLE 7

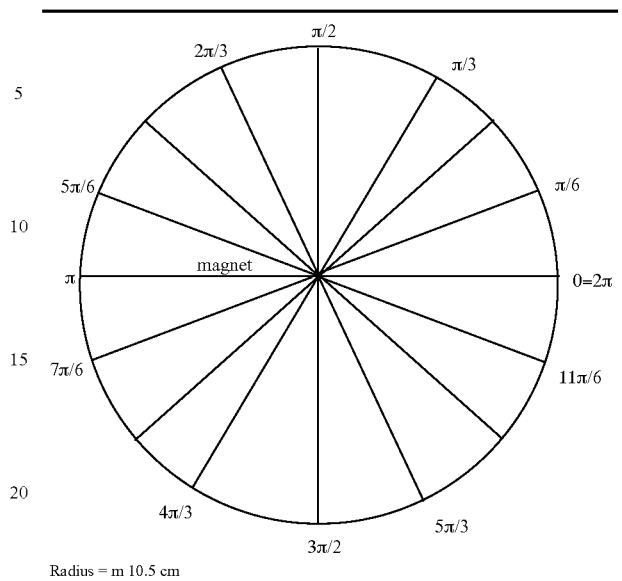

Radius = m 10.5 cm

As shown in Tables 8 and 9, below, the radial sensing test results indicate that the prototype system accurately senses at every $\pi/6$. The deviations in buzzer output along the circle in the xy and xz plane were 1.28 dB and 1.97 dB, respectively. This deviation is negligible, and the tests show that buzzer output was constant for the ranges tested.

TABLE 8

Radial Sensing in xy Plane

| Degree measure xy plane | Distance from Sensor (cm) | Field Strength (Gauss) | Decibel Output (dB) | Deviation in Decibel Output |
|---|---|---|---|---|
| 0 | 10.5 | 5.0 | 88 | .4 |
| $\pi/6$ | 10.5 | 5.0 | 88 | .4 |
| $\pi/3$ | 10.5 | 4.9 | 87 | .6 |
| $\pi/2$ | 10.5 | 5.1 | 88 | .4 |
| $2\pi/3$ | 10.5 | 5.2 | 86 | 1.6 |
| $5\pi/6$ | 10.5 | 4.9 | 86 | 1.6 |
| $\pi$ | 10.5 | 5.1 | 88 | .4 |
| $7\pi/6$ | 10.5 | 4.9 | 86 | 1.6 |
| $4\pi/3$ | 10.5 | 5.0 | 88 | .4 |
| $3\pi/2$ | 10.5 | 5.2 | 84 | 3.6 |
| $5\pi/3$ | 10.5 | 4.9 | 88 | .4 |
| $11\pi/6$ | 10.5 | 5.0 | 88 | .4 |
| $2\pi$ | 10.5 | 5.0 | 88 | .4 |
| Averages | 10.5 | 5.0 | 87.6 | 1.28 |

TABLE 9

Radial Sensing in xz Plane

| Degree measure xz plane | Distance from Sensor (cm) | Field Strength (Gauss) | Decibel Output (dB) | Deviation in Decibel Output |
|---|---|---|---|---|
| 0 | 10.5 | 4.9 | 88 | .8 |
| $\pi/6$ | 10.5 | 5.2 | 86 | 1.2 |
| $\pi/3$ | 10.5 | 5.2 | 88 | .8 |
| $\pi/2$ | 10.5 | 5.1 | 90 | 2.8 |
| $2\pi/3$ | 10.5 | 5.0 | 91 | 3.8 |

TABLE 9-continued

Radial Sensing in xz Plane

| Degree measure xz plane | Distance from Sensor (cm) | Field Strength (Gauss) | Decibel Output (dB) | Deviation in Decibel Output |
|---|---|---|---|---|
| 5π/6 | 10.5 | 4.8 | 88 | .8 |
| π | 10.5 | 4.9 | 84 | 3.2 |
| 7π/6 | 10.5 | 4.9 | 85 | 2.2 |
| 4π/3 | 10.5 | 5.0 | 89 | 1.8 |
| 3π/2 | 10.5 | 5.1 | 88 | .8 |
| 5π/3 | 10.5 | 5.1 | 89 | 1.8 |
| 11π/6 | 10.5 | 5.1 | 88 | .8 |
| 2π | 10.5 | 4.9 | 86 | 1.2 |
| Averages | 10.5 | 5.0 | 87.2 | 1.97 |

Material Testing

Results of testing for accuracy, shielding and durability are given in Tables 10-12, below.

TABLE 10

Accuracy Test Results

| Trial | five Gauss (Y/N*) | 4 Gauss (Y/N*) |
|---|---|---|
| 1 | Yes | No |
| 2 | Yes | No |
| 3 | Yes | No |
| 4 | Yes | No |
| 5 | Yes | No |
| 6 | Yes | No |
| 7 | Yes | No |
| 8 | Yes | No |
| 9 | Yes | No |
| 10 | Yes | No |

TABLE 11

Shielding Test Results

| Material | five Gauss (Y/N*) |
|---|---|
| Aluminum (1 mm) | Yes |
| Plastic (2 mm) | Yes |
| Skin (hand) | Yes |
| Clothing | Yes |
| Plexiglas (0.5 cm) | Yes |
| Wood (1.8 cm) | Yes |
| Rubber (7 mm) | Yes |

TABLE 12

Durability Test Results

| Dropping (6 inches) | Worked (Y/N*) | Banged | Worked (Y/N*) |
|---|---|---|---|
| 1 | Yes | 1 | Yes |
| 2 | Yes | 2 | Yes |
| 3 | Yes | 3 | Yes |
| 4 | Yes | 4 | Yes |
| 5 | Yes | 5 | Yes |
| 6 | Yes | 6 | Yes |
| 7 | Yes | 7 | Yes |
| 8 | Yes | 8 | Yes |
| 9 | Yes | 9 | Yes |
| 10 | Yes | 10 | Yes |

*Yes means the device still worked as the baseline.

Since certain changes may be made in the above methods and systems without departing from the scope hereof, it is intended that all matter contained in the above description or shown in the accompanying drawing be interpreted as illustrative and not in a limiting sense. It is also to be understood that the following claims are to cover certain generic and specific features described herein.

What is claimed is:

1. A magnetic proximity sensor system, comprising:
    at least one modified reed switch having:
        a switch housing;
        a conductive hemispheric contact secured within the switch housing;
        a magnetic contact having a first end anchored with the switch housing and a second end centered with the hemispheric contact; and
        a stiffening filament for supporting the magnetic contact; the stiffening filament being sufficiently flexible to bend when an external magnetic force of a preselected strength deflects the magnetic contact;
    wherein the magnetic contact is deflected into connection with the hemispheric contact, to close a switch circuit; and
    wherein an external magnetic force of sufficient strength to overcome the supportive stiffening filament deflects the magnetic contact and flexes the stiffening filament, the second end contacting the hemispheric contact to close a switch circuit.

2. The sensor system of claim 1, further comprising:
    an alarm in communication with the at least one reed switch, for generating an alarm signal when the switch circuit closes;
    a housing for protecting the at least one reed switch and the alarm; and
    an electrical contact for connecting to a battery or external power source, for powering the alarm.

3. The sensor system of claim 2, wherein the conductive hemispheric contact is non-magnetic.

4. A modified reed switch, comprising:
    a housing;
    a conductive hemispheric contact secured within the housing;
    a magnetic contact having a first end anchored with the housing and a second end centered with the hemispheric contact; and
    a stiffening filament for supporting the magnetic contact, the stiffening filament chosen to withstand flexing due to external magnetic forces acting upon the magnetic contact, up to a selected threshold magnetic field strength;
    wherein under magnetic fields above the threshold strength, deflection of the magnetic contact bends the stiffening filament and the second end of the magnetic contact contacts the hemispheric contact to close a switch circuit.

5. The sensor system of claim 4, the conductive hemispheric contact comprising one or more supports for stabilizing the hemispheric contact within the switch housing.

6. The sensor system of claim 4, the conductive hemispheric contact comprising a wire extending through the switch housing.

7. The sensor system of claim 4, the magnetic contact selected from the group of:
    a ferromagnetic reed; and
    a wire with a ferrous bead at the second end.

8. The sensor system of claim 4, the magnetic contact comprising a wire with a ferrous bead at the second end, the stiffening filament comprising a first filament connected with the bead and with an end of the switch housing; further comprising a second stiffening filament connected with an opposite end of the switch housing and with the bead, opposite the first filament.

9. The sensor system of claim 4, the stiffening filament comprising a sheath for supporting the magnetic contact, the second end of the magnetic contact extending from the sheath.

10. The sensor system of claim 4, the magnetic contact comprising a wire with a ferrous bead at the second end; further comprising a conductive wire connected with the bead at one end, a second end of the conductive wire extending through the switch housing.

11. The sensor system of claim 10, the second end of the conductive wire connecting with an electrical contact external to the switch housing.

12. The sensor system of claim 4, the stiffening filament comprising a polymer.

13. The sensor system of claim 4, wherein the stiffening filament is manufactured to flex when a magnetic field of a selected strength acts upon the magnetic contact.

14. The sensor system of claim 2, the alarm selected from the group consisting of an audible alarm, a visual alarm and a tactile alarm.

15. The sensor system of claim 2, the alarm comprising an audible alarm; further comprising a speaker for playing the audible alarm.

16. The sensor system of claim 1, the stiffening filament chosen to withstand flexing due to external magnetic forces acting upon the magnetic contact, up to a selected threshold magnetic field strength.

17. The sensor system of claim 2, the housing comprising means for securing the sensor to a person or to a movable metal object.

18. The sensor system of claim 1, the conductive hemispheric contact comprising one or more supports for stabilizing the hemispheric contact within the switch housing.

19. The sensor system of claim 1, the conductive hemispheric contact comprising a wire extending through the switch housing.

20. The sensor system of claim 1, the magnetic contact selected from the group of:
a ferromagnetic reed; and
a wire with a ferrous bead at the second end.

21. The sensor system of claim 1, the magnetic contact comprising a wire with a ferrous bead at the second end, the stiffening filament comprising a first filament connected with the bead and with an end of the switch housing; further comprising a second stiffening filament connected with an opposite end of the switch housing and with the bead, opposite the first filament.

22. The sensor system of claim 1, the stiffening filament comprising a sheath for supporting the magnetic contact, the second end of the magnetic contact extending from the sheath.

23. The sensor system of claim 1, the magnetic contact comprising a wire with a ferrous bead at the second end; further comprising a conductive wire connected with the bead at one end, a second end of the conductive wire extending through the switch housing.

24. The sensor system of claim 23, the second end of the conductive wire connecting with an electrical contact external to the switch housing.

25. The sensor system of claim 1, the stiffening filament comprising a polymer.

\* \* \* \* \*